United States Patent
Chu et al.

(10) Patent No.: US 12,080,766 B2
(45) Date of Patent: *Sep. 3, 2024

(54) EPITAXIAL BACKSIDE CONTACT

(71) Applicant: Taiwan Semiconductor Manufacturing Co., Ltd., Hsin-Chu (TW)

(72) Inventors: Chia-Hung Chu, Taipei (TW); Tsungyu Hung, Hsinchu (TW); Hsu-Kai Chang, Hsinchu (TW); Ding-Kang Shih, New Taipei (TW); Keng-Chu Lin, Hsinchu (TW); Pang-Yen Tsai, Jhu-bei (TW); Sung-Li Wang, Hsinchu County (TW); Shuen-Shin Liang, Hsinchu County (TW)

(73) Assignee: TAIWAN SEMICONDUCTOR MANUFACTURING CO., LTD, Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/297,854

(22) Filed: Apr. 10, 2023

(65) Prior Publication Data
US 2023/0246082 A1   Aug. 3, 2023

Related U.S. Application Data

(63) Continuation of application No. 17/140,663, filed on Jan. 4, 2021, now Pat. No. 11,626,494.
(Continued)

(51) Int. Cl.
*H01L 29/417* (2006.01)
*H01L 21/02* (2006.01)
(Continued)

(52) U.S. Cl.
CPC .. *H01L 29/41733* (2013.01); *H01L 21/02532* (2013.01); *H01L 21/02603* (2013.01);
(Continued)

(58) Field of Classification Search
CPC ......... H01L 29/41733; H01L 21/02532; H01L 21/02603; H01L 21/28518; H01L 23/5286;
(Continued)

(56) References Cited

U.S. PATENT DOCUMENTS 11,626,494 B2 * 4/2023 Chu ................. H01L 29/41733
257/347
2011/0241073 A1  10/2011 Cohen et al.
(Continued)

FOREIGN PATENT DOCUMENTS

KR  20190015269 A   2/2019
KR  20190036533 A   4/2019
(Continued)

OTHER PUBLICATIONS

Liao, Yi-Bo et al., "Source/Drain Contact Structure," U.S. Appl. No. 17/093,230, filed Nov. 9, 2020, Assignee: Taiwan Semiconductor Manufacturing Co., Ltd., 50 pages specification, 57 pages drawings.
(Continued)

*Primary Examiner* — Tong-Ho Kim
(74) *Attorney, Agent, or Firm* — HAYNES AND BOONE, LLP

(57) ABSTRACT

A semiconductor device structure according to the present disclosure includes a source feature and a drain feature, at least one channel structure extending between the source feature and the drain feature, a gate structure wrapped around each of the at least one channel structure, a semiconductor layer over the gate structure, a dielectric layer over the semiconductor layer, a doped semiconductor fea-
(Continued)

ture extending through the semiconductor layer and the dielectric layer to be in contact with the source feature, a metal contact plug over the doped semiconductor feature, and a buried power rail disposed over the metal contact plug.

20 Claims, 16 Drawing Sheets

Related U.S. Application Data

(60) Provisional application No. 63/040,092, filed on Jun. 17, 2020.

(51) Int. Cl.
| | | |
|---|---|---|
| *H01L 21/285* | (2006.01) | |
| *H01L 23/528* | (2006.01) | |
| *H01L 29/06* | (2006.01) | |
| *H01L 29/423* | (2006.01) | |
| *H01L 29/45* | (2006.01) | |
| *H01L 29/66* | (2006.01) | |
| *H01L 29/786* | (2006.01) | |

(52) U.S. Cl.
CPC .... *H01L 21/28518* (2013.01); *H01L 23/5286* (2013.01); *H01L 29/0673* (2013.01); *H01L 29/42392* (2013.01); *H01L 29/45* (2013.01); *H01L 29/66742* (2013.01); *H01L 29/78618* (2013.01); *H01L 29/78696* (2013.01)

(58) Field of Classification Search
CPC ........... H01L 29/0673; H01L 29/42392; H01L 29/45; H01L 29/66742; H01L 29/78618; H01L 29/78696; H01L 21/28525; H01L 21/76831; H01L 21/76897; H01L 29/458; H01L 29/0847; H01L 29/42376; H01L 29/66439; H01L 29/66545; H01L 27/0886; H01L 21/823431; H01L 21/823475; H01L 21/823412; H01L 21/823425; H01L 21/823437; H01L 21/823462; H01L 27/088
USPC .......................................................... 257/347
See application file for complete search history.

(56) References Cited

U.S. PATENT DOCUMENTS

| | | |
|---|---|---|
| 2012/0273798 A1 | 11/2012 | Alptekin et al. |
| 2019/0035521 A1 | 1/2019 | Ohkoshi |
| 2019/0164882 A1 | 5/2019 | Chen |
| 2019/0198639 A1 | 6/2019 | Kim et al. |
| 2020/0035560 A1 | 1/2020 | Block et al. |
| 2020/0152740 A1* | 5/2020 | Jang .................. H01L 29/66553 |

FOREIGN PATENT DOCUMENTS

| | | |
|---|---|---|
| KR | 20190072674 A | 6/2019 |
| KR | 20190078818 A | 7/2019 |
| KR | 20200060380 A | 5/2020 |
| WO | 2018004653 A1 | 1/2018 |
| WO | 2018031175 A1 | 2/2018 |

OTHER PUBLICATIONS

Chu, Lung-Kun et al., "Self-Aligned Backside Source Contact Structure," U.S. Application No. 17/016,109, filed Sep. 9, 2020, Assignee: Taiwan Semiconductor Manufacturing Co., Ltd., 31 pages specification, 17 drawings.

Su, Huan-Chieh et al., "Backside Power Rail and Methods of Forming the Same," U.S. Appl. No. 16/901,963, filed Jun. 15, 2020, Assignee: Taiwan Semiconductor Manufacturing Co., Ltd., 29 pages specification, 22 pages drawings.

Wang, Pei-Wei et al., "Method of Forming Backside Power Rails," U.S. Appl. No. 17/037,274, filed Sep. 29, 2020, Assignee: Taiwan Semiconductor Manufacturing Company, Ltd., 29 pages specification, 16 pages drawings.

\* cited by examiner

EPITAXIAL BACKSIDE CONTACT

PRIORITY DATA

This application is a continuation of U.S. patent application Ser. No. 17/140,663, filed Jan. 4, 2021, which claims the benefit of U.S. Provisional Application No. 63/040,092, filed Jun. 17, 2020, each of which is incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor.

Implementation of multi-gate transistors reduces device dimensions and increase device packing density, which poses challenges in forming power and signal routing. The development of buried power rails has eased some of the pressure to form power and signal routing to densely packed devices. The resistance at the interface between a backside contact and an epitaxial source/drain feature is the bottleneck in reducing the contact resistance. Although existing buried power rail structure are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-10, 11A-15A, and 11B-15B illustrate fragmentary cross-sectional views of a workpiece during a fabrication process according to the method of FIG. 1, according to one or more aspects of the present disclosure.

DETAILED DESCRIPTION

Figure 1:
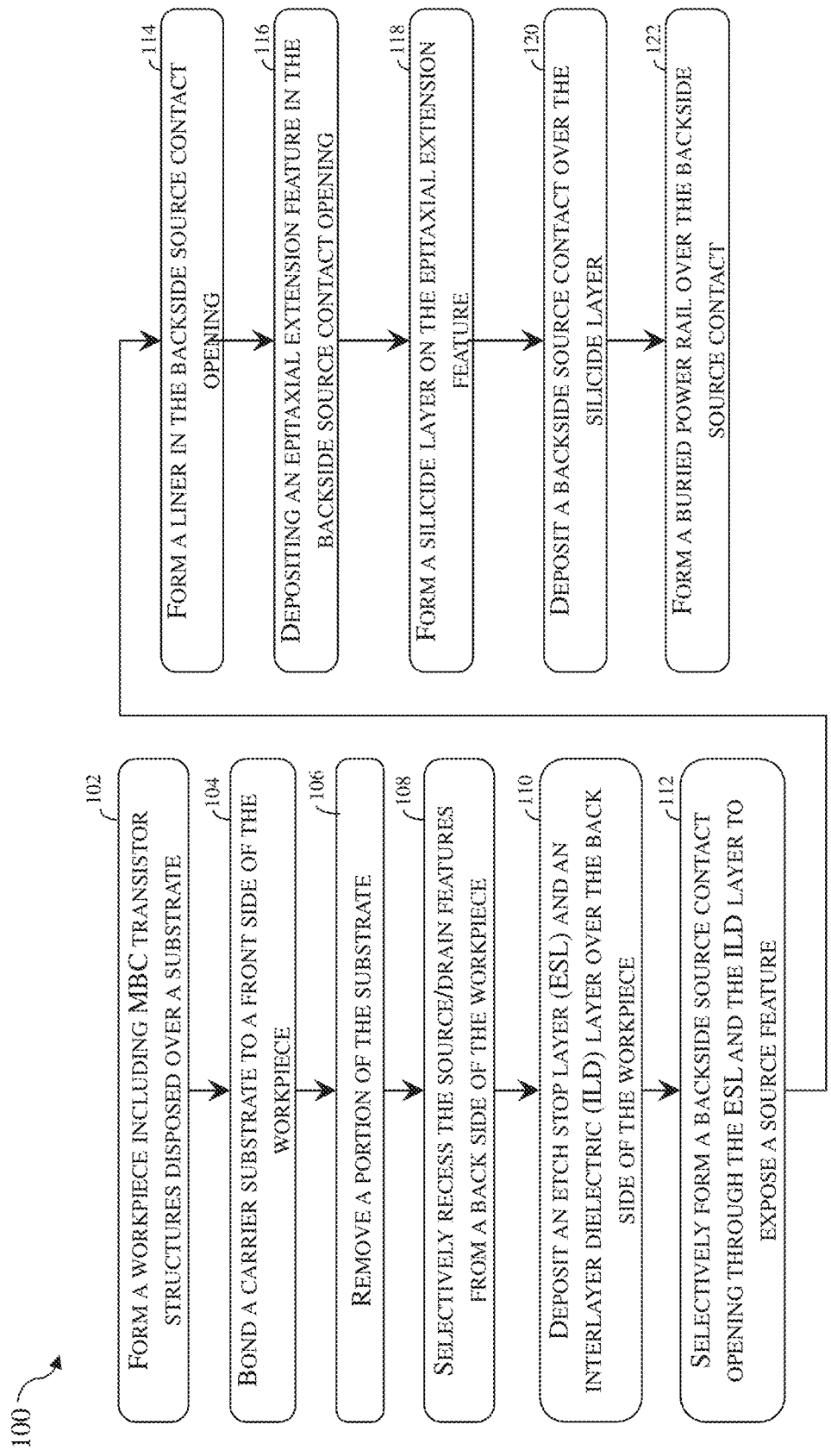
FIG. 1 illustrates a flow chart of a method for forming a semiconductor device having a buried power rail, according to one or more aspects of the present disclosure.
Figure 2:
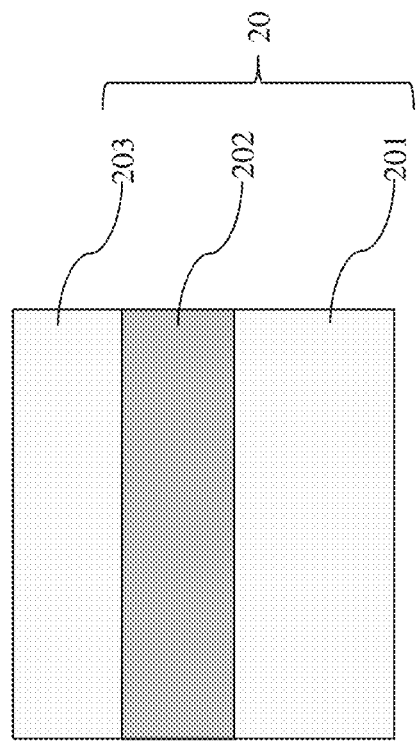

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to backside contact structures and methods of forming the same, and more particularly to an epitaxial extension feature that increase an interface area between the backside source contact and the source feature.

Conventionally, source/drain contacts and gate contacts of transistors on a substrate connect source/drain features of the transistors to an interconnect structure over a front side of the substrate. As the dimensions of IC devices shrink, the close proximity among the source contacts and gate contacts may reduce process windows for forming these contacts and may increase parasitic capacitance among them. The buried power rail (BPR) structure is a modern solution for performance boost on power delivery network (PDN) for advanced technology node and it eases the crowding of contacts. To decrease the resistance in a buried power rail structure, the challenge lies in reduction of the resistance at the metal-semiconductor interface. Although advances are made by introduction of new materials (such as ruthenium, cobalt, tungsten, or titanium) and new processes (such as barrier-less contact or seed-free processes), high contact-to-source/drain resistance (Rcsd) attributable to the metal-semiconductor interface remains an issue. When a bottom dimension of a contact via is smaller than 10 nm, resistance of small interface area becomes a bottleneck that determines the contact resistance.

The present disclosure provides embodiments of buried power rail structures that have a reduced resistance. According to the present disclosure, after a source feature is exposed from the back side of a workpiece, a doped semiconductor feature is epitaxially grown from the exposed source feature to serve as an extension of the source feature. The doped semiconductor feature extends through a bottom dielectric layer and includes an end portion that has a surface area greater than a surface area of the source feature. A backside contact feature is then formed over the end portion to connect the same to a buried power rail. The increased surface area of the end portion helps to reduce the resistance between the source feature and the buried power rail.

The various aspects of the present disclosure will now be described in more detail with reference to the figures. In that regard, FIG. 1 is a flowchart illustrating method 100 of forming a semiconductor device from a workpiece 200 (shown at least in FIGS. 2-10, 11A-15A, and 11B-15B) according to embodiments of the present disclosure. Method 100 is merely an example and is not intended to limit the present disclosure to what is explicitly illustrated in method 100. Additional steps can be provided before, during and after the method 100, and some steps described herein can be replaced, eliminated, or moved around for additional embodiments of the method. Not all steps are described herein in detail for reasons of simplicity. Method 100 is described below in conjunction with FIGS. 2-10, 11A-15A, and 11B-15B which are fragmentary cross-sectional views of the workpiece at different stages of fabrication according to embodiments of method 100. For better illustration of various aspects of the present disclosure, FIGS. 2-10, 11A-15A, and 11B-15B may include cross-sectional views along different directions. Because the workpiece 200 will be fabricated into a semiconductor device 200 upon conclusion of the fabrication processes, the workpiece 200 may be referred to as the semiconductor device 200 as the context requires.

Figure 3:
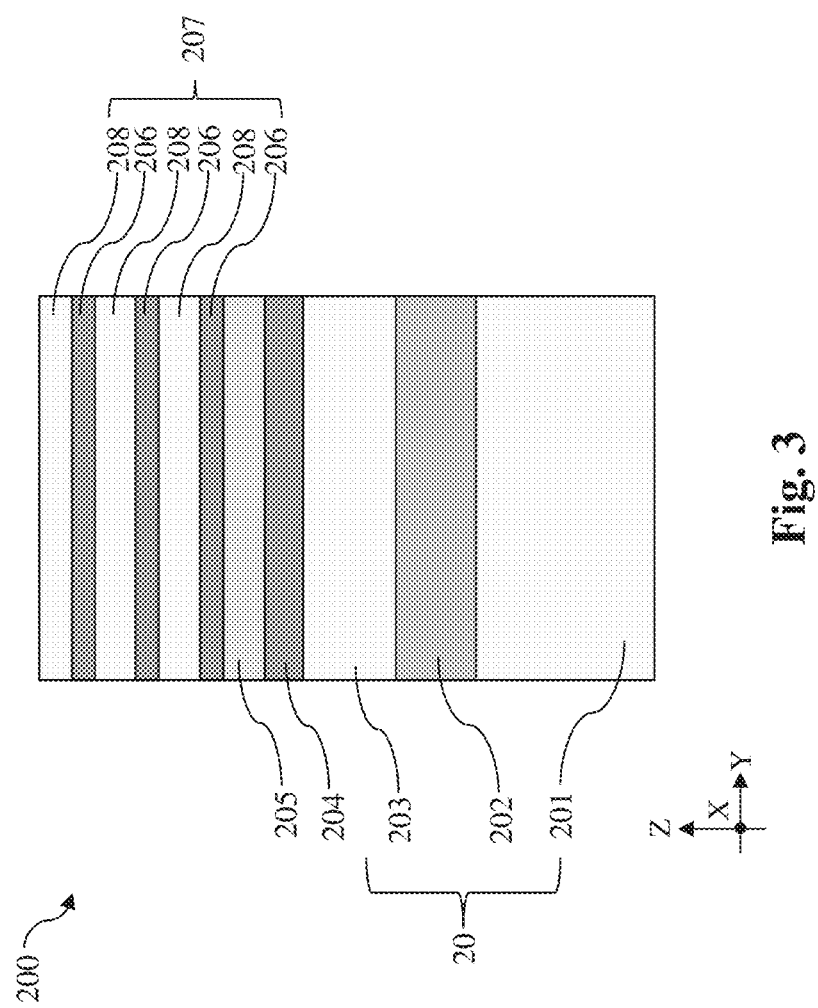
Figure 4:
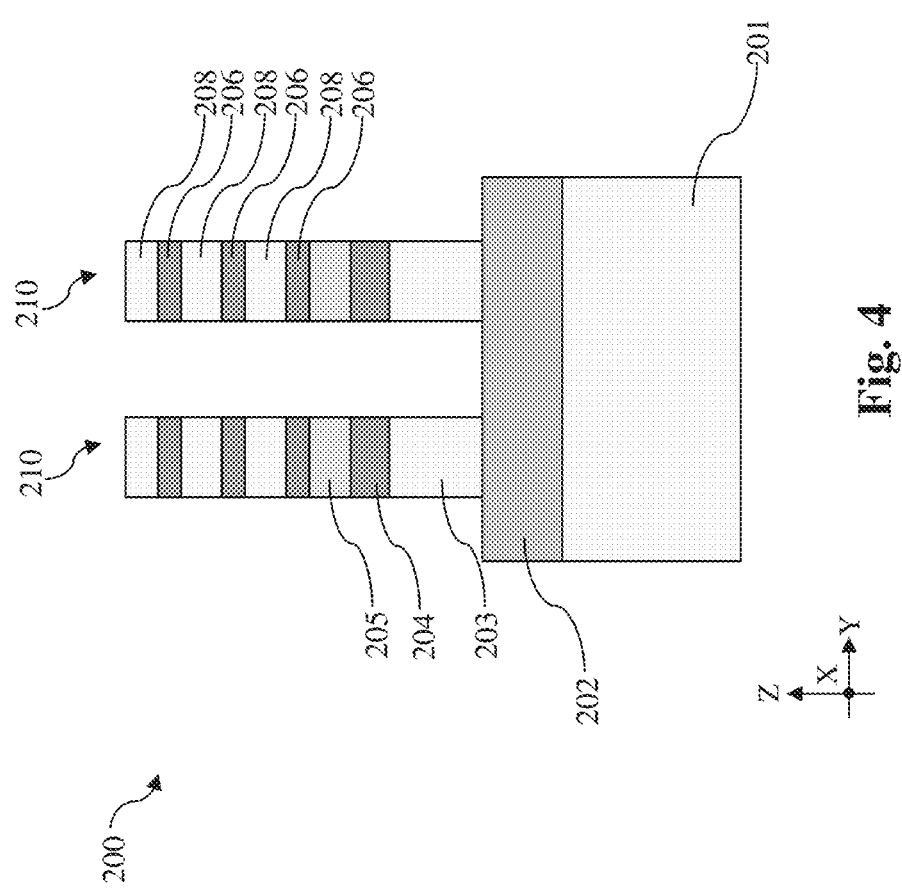
Figure 5:
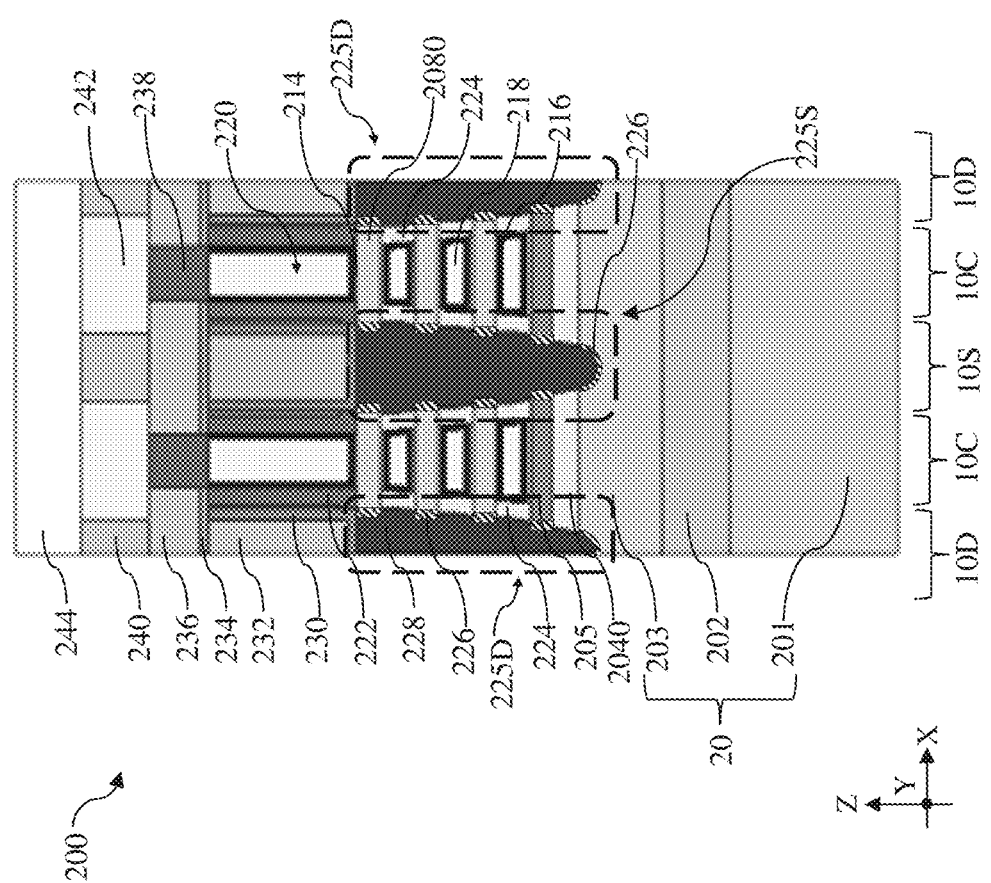

Referring to FIGS. 1-5, method 100 includes a block 102 where a workpiece 200 is formed. The formation process of the workpiece 200 shown in FIG. 5 is representatively illustrated in FIGS. 1-5. The formation of the workpiece 200 may start with receiving a substrate 20 shown in FIG. 2. The substrate 20 may be a silicon-on-insulator (SOI) substrate that includes a base silicon layer 201, an insulation layer 202, and a top silicon layer 203. In some implementations, the base silicon layer 201 and the top silicon layer 203 are formed of silicon and the insulation layer 202 includes silicon oxide. Referring to FIG. 3, a bottom sacrificial layer 204, a bottom semiconductor layer 205, and a stack 207 are deposited over the substrate 20. The bottom sacrificial layer 204 may include silicon germanium (SiGe) and the bottom semiconductor layer 205 may include silicon (Si). The stack 207 includes a plurality of channel layers 208 interleaved by a plurality of sacrificial layers 206. Although three (3) sacrificial layers 206 and three (3) channel layers 208 are shown in the figures, the present disclosure is not so limited. The numbers of sacrificial layers 206 and the channel layers 208 may be between 2 and 10 according to various design requirements. In some instances, the plurality of channel layers 208 may include silicon (Si) and the plurality of sacrificial layers 206 may include silicon germanium (SiGe). Although the bottom sacrificial layer 204 and the plurality of sacrificial layers 206 are both formed of silicon germanium, they may have different germanium contents. The bottom sacrificial layer 204, the bottom semiconductor layer 205, and the stack 207 may be epitaxially deposited using molecular beam epitaxy (MBE), vapor-phase epitaxy (VPE), ultra-high vacuum CVD (UHV-CVD), and/or other suitable epitaxial growth processes.

Referring to FIG. 4, the stack 207, the bottom semiconductor layer 205, the bottom sacrificial layer 204, and the top silicon layer 203 are patterned into fin-shaped structures 210 that extend lengthwise along the Y direction. In some implementations, an etch chemistry that is selective to semiconductor materials may be used to pattern the fin-shaped structures 210. In these implementations, the insulation layer 202, which is formed of silicon oxide, serves as an etch stopper. After the fin-shaped structures 210 are formed, an isolation feature 212 (shown in FIGS. 11B-15B) is formed between fin-shaped structures 210 while a portion of the fin-shaped structures 210 rise above the isolation feature. The isolation feature 212 may also be referred to as a shallow trench isolation (STI) feature. The isolation feature 212 may include silicon oxide, silicon nitride, silicon oxynitride, fluorine-doped silicate glass (FSG), a low-k dielectric, combinations thereof, and/or other suitable materials.

Referring to FIG. 5, after formation of an insulation feature, dummy gate stacks (not shown) and gate spacers 222 are formed over channel regions 10C of the fin-shaped structures 210. With dummy gate stacks and gate spacers serving as etch masks, source regions 10S and drain regions 10D of the fin-shaped structures 210 are recessed to form source recesses and drain recesses that expose sidewalls of the plurality of sacrificial layers 206 and the channel layers 208. The sacrificial layers 206 are then partially and selectively recessed to form inner spacer recesses. Inner spacer features 224 are deposited into the inner spacer recesses. In some embodiments, the inner spacer features 224 may include silicon oxynitride, silicon carbonitride, silicon oxycarbide, silicon oxycarbonitride, silicon nitride, carbon-rich silicon carbonitride, or a suitable dielectric material. After the formation of the inner spacer features 224, the bottom sacrificial layer 204 is replaced with a bottom dielectric layer 2040. In some embodiments, the bottom sacrificial layer 204 may first be oxidized to form a silicon germanium oxide layer and the silicon germanium oxide layer is selectively removed to leave behind a bottom opening between the top silicon layer 203 and the bottom semiconductor layer 205. Thereafter, the bottom dielectric layer 2040 is then deposited in the bottom opening. In some embodiments, the bottom dielectric layer 2040 may include silicon oxide, silicon nitride, aluminum oxide, hafnium oxide, zirconium oxide, or other suitable dielectric materials. In some instances, the bottom dielectric layer 2040 may have a thickness between about 10 nm and about 30 nm, along the Z direction. A thickness of the bottom semiconductor layer 205 may be reduced during formation of the inner spacer features. In some extreme example, the bottom semiconductor layer 205 has a relatively thin initial thickness and its entire thickness may be etched away during formation of inner spacer features. In some instances, the bottom semiconductor layer 205 in the workpiece 200 shown in FIG. 5 may have a thickness between about 0 nm and about 40 nm.

After the formation of the bottom dielectric layer 1040, source features 225S are deposited over source regions 10S and drain features 225D are deposited over drain regions 10D. The source features 225S and the drain features 225D may be epitaxially deposited using molecular beam epitaxy (MBE), vapor-phase epitaxy (VPE), ultra-high vacuum CVD (UHV-CVD)), and/or other suitable epitaxial growth processes. In the depicted embodiments, each of the source features 225S and the drain features 225D may include an outer layer 226 and an inner layer 228. The outer layer 226 and the inner layer 228 are sequentially formed. The outer layer 226 is deposited by epitaxial growth from sidewalls of the channel layers 208 and the exposed surfaces of the top silicon layer 203. Then the inner layer 228 is epitaxially grown from the surfaces of the outer layer 226. Depending on the types of the MBC transistors to be formed on the workpiece 200, the source features 225S and the drain features 225D may have different compositions. When n-type MBC transistors are desired, the source features 225S and the drain features 225D may include silicon and may be doped with an n-type dopant, such as phosphorus (P), arsenic (As), or antimony (Sb). When p-type MBC transistors are desired, the source features 225S and the drain features 225D may include silicon germanium and may be doped with a p-type dopant, such as boron (B) or gallium (Ga). A composition of the outer layer 226 and a composition of the inner layer 228 may be different. In some embodiments, the outer layer 226 and the inner layer 228 may be doped with different dopant species. For example, the outer layer 226 may be doped with arsenic and the inner layer 228 may be doped with phosphorus. In some other embodiments, the outer layer 226 and the inner layer may include different dopant concentrations. For example, in order to reduce contact resistance, a doping concentration of the inner layer 228 may be greater than a doping concentration of the outer layer 226. As shown in FIG. 5, the inner layer 228 is spaced apart from the channel layers 208 (released as channel members 2080 in FIG. 5) and the top silicon layer 203 by the outer layer 226.

Reference is still made to FIG. 5. After the formation of the source features 225S and the drain features 225D, a contact etch stop layer (CESL) 230 and a first interlayer dielectric layer (ILD) layer 232 are formed over the source features 225S and the drain features 225D. In some examples, the CESL 230 may include silicon nitride, silicon oxynitride, and/or other materials known in the art. The CESL 230 may be formed by ALD, plasma-enhanced chemical vapor deposition (PECVD) process and/or other suitable deposition or oxidation processes. The first ILD layer 232 is then deposited over the CESL 230. In some embodiments, the first ILD layer 232 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), silicon oxycarbide, silicon oxycarbonitride, and/or other suitable dielectric materials. The first ILD layer 232 may be deposited by a PECVD process or other suitable deposition technique. In some embodiments, after formation of the first ILD layer 232, the workpiece 200 may be annealed to improve integrity of the first ILD layer 232. After the deposition of the CESL 230 and the first ILD layer 232, the workpiece 200 may be planarized by a planarization process to expose the dummy gate stacks. The dummy gate stacks and the sacrificial layers 206 are then selectively removed to release the channel layers 208 in the channel regions 10C as channel members 2080.

Gate structures 220 are then deposited over the channel regions 10C to wrap around each of the channel members 2080. Each of the gate structures 220 may include an interfacial layer 214, a gate dielectric layer 216 over the interfacial layer 214, and a gate electrode layer 218 over the gate dielectric layer 216. In some embodiments, the interfacial layer 214 may include a dielectric material such as silicon oxide, hafnium silicate, or silicon oxynitride. The gate dielectric layer 216 may include a high-K dielectric material such as hafnium oxide. As used herein, a high-K dielectric material refers to a dielectric material with a dielectric constant greater than that of silicon oxide (~3.9). Alternatively, the gate dielectric layer 216 may include other high-K dielectrics, such as hafnium oxide (HfO), titanium oxide (TiO2), hafnium zirconium oxide (HfZrO), tantalum oxide (Ta2O5), hafnium silicon oxide (HfSiO4), zirconium oxide (ZrO2), zirconium silicon oxide (ZrSiO2), lanthanum oxide (La2O3), aluminum oxide (Al2O3), zirconium oxide (ZrO), yttrium oxide (Y2O3), SrTiO3 (STO), BaTiO3 (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)TiO3 (BST), silicon nitride (SiN), silicon oxynitride (SiON), combinations thereof, or other suitable material. The gate electrode layer 218 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer 218 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, after the deposition of the gate electrode layer 218, a planarization process, such as a chemical mechanical polishing (CMP) process, may be performed to remove excessive metal from the workpiece 200, thereby providing substantially planar top surfaces of the gate structures 220. Upon formation of the gate structures, MBC structures are substantially formed on the workpiece 200.

After the formation of the MBC structures, further processes are performed to form structures to interconnect the MBC structures. Reference is still made to FIG. 5. In some embodiments, a gate capping layer 234 and a first dielectric layer 236 are sequentially deposited over the gate structures 220 and gate contact vias 238 are formed to couple to the gate structures. As shown in FIG. 5, the gate contact vias 238 vertically extend through the gate capping layer 234 and the first dielectric layer 236. A second dielectric layer 240 is deposited over the gate contact vias 238 and metal lines 242 are deposited in the second dielectric layer 240 to electrically couple to the gate contact vias 238. In some embodiments, the first dielectric layer 236 and the second dielectric layer 240 may have the same composition with the first ILD layer 232. Each of the gate contact vias 238 and the metal lines 242 may include a metal fill layer and a barrier layer that spaces the metal fill layer from the surrounding dielectric layer. In some implementations, the barrier layer may include a metal nitride, such as titanium nitride or tantalum nitride and the metal fill layer may include a metal, such as copper, ruthenium, tungsten, nickel, or cobalt. Although not explicitly shown in FIG. 5, additional interconnect layers may be formed over the metal lines 242. In some embodiments, an entirety of a front-side interconnect structure (that includes the second dielectric layer 240 and the metal lines 242) is formed before the workpiece 200 is bonded to a carrier substrate, such as the carrier substrate 248 (to be described below). Additionally, although not explicitly shown, one or more front-side source/drain contact vias may be formed to couple the source features 225S or the drain features 225D. Such front-side source contact vias may extend through the CESL 230, the first ILD layer 232, the gate capping layer 234, and the first dielectric layer 236. As shown in FIG. 5, in order to prepare the workpiece 200 for bonding to a carrier substrate, a first oxide layer 244 is deposited over the metal lines 242 and the second dielectric layer 240. The first oxide layer 244 may include silicon oxide.

Figure 6:
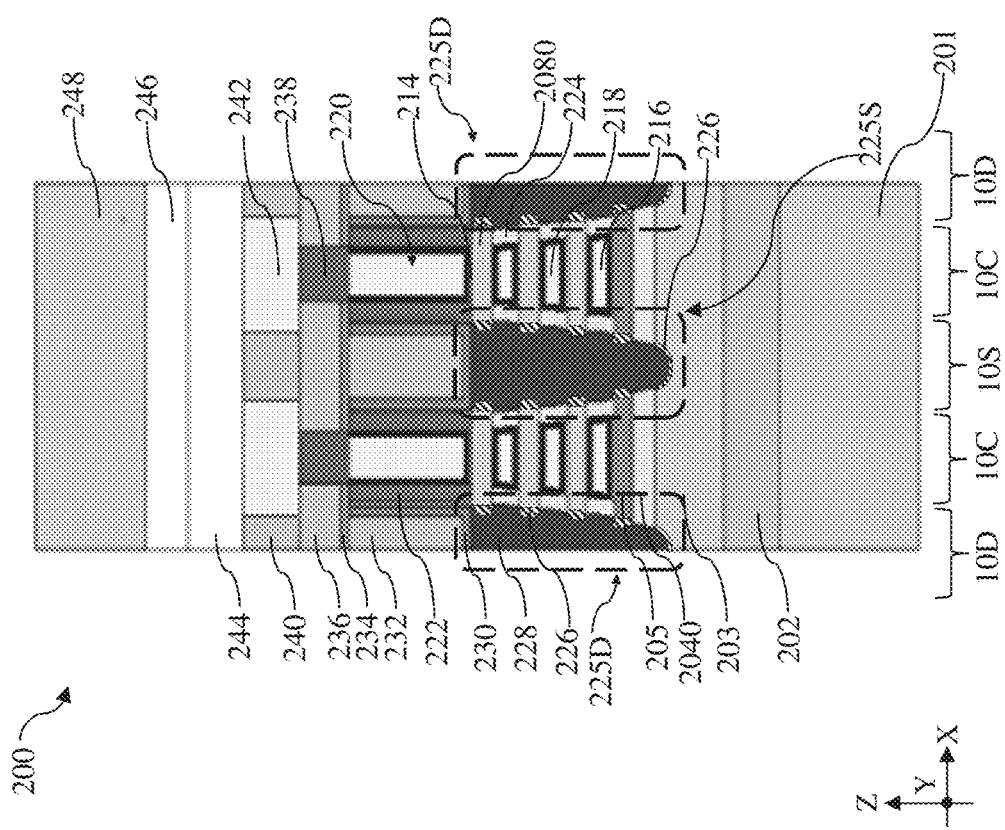
Figure 7:
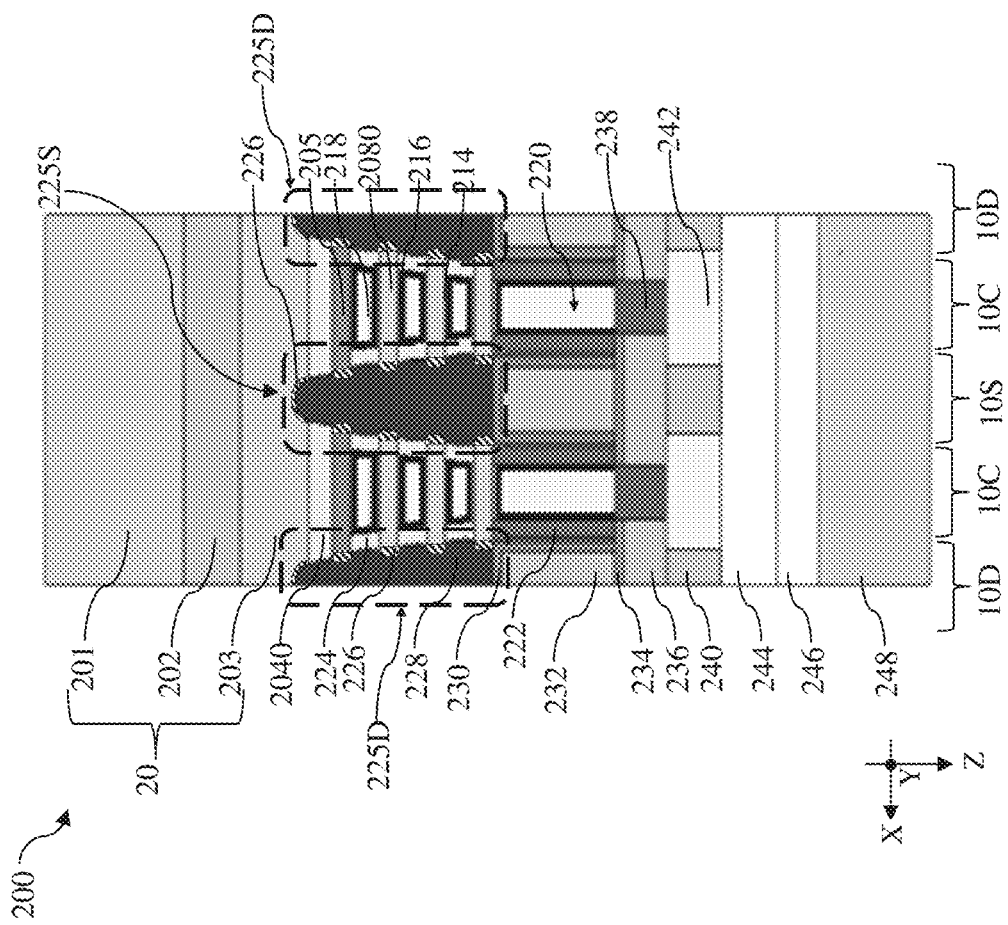

Referring to FIGS. 1, 6 and 7, method 100 includes a block 104 where a carrier substrate 248 is bonded on a front side of the workpiece 200. At block 104, a carrier substrate 248 is bonded to the workpiece 200 by fusion bonding, by use of an adhesion layer, or a combination thereof. In some instances, the carrier substrate 248 may be formed of semiconductor materials (such as silicon), sapphire, glass, polymeric materials, or other suitable materials. In embodiments where fusion bonding is used, the carrier substrate 248 includes a second oxide layer 246. After both the first oxide layer 244 and the second oxide layer 246 are treated, they are placed in flush contact with one another for direct bonding at room temperature or at an elevated temperature. Once the carrier substrate 248 is bonded to the front side of the workpiece 200, the workpiece 200 is flipped over, as shown in FIG. 7. As illustrated in FIG. 7, after the workpiece 200 is flipped over, the substrate 20 is pointed upwards such that the base silicon layer 201 is disposed over the insulation layer 202.

Figure 8:
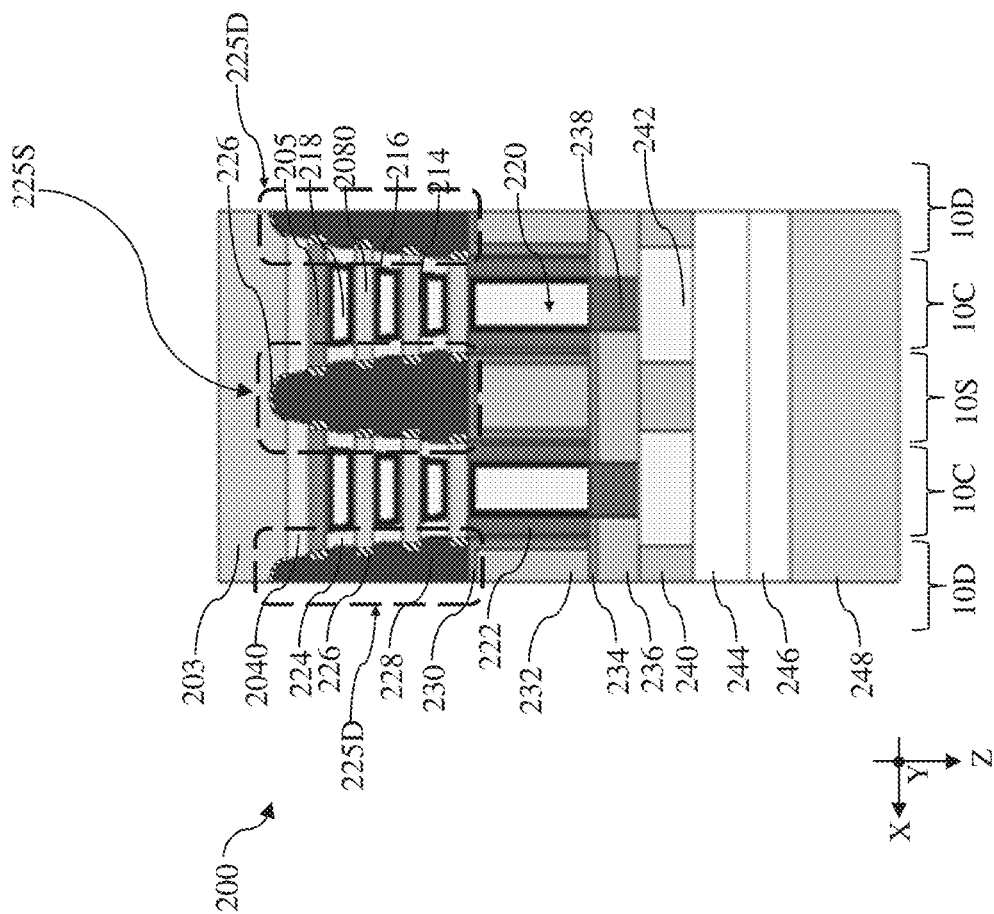

Referring to FIGS. 1 and 8, method 100 includes a block 106 where a portion of the substrate is removed. As shown in FIG. 8, at block 106, the base silicon layer 201 and the insulation layer 202 are removed by a grinding process or a planarization process, such as a CMP process, until the isolation feature 212 (shown in FIGS. 11B-15B) and the top silicon layer 203 are planar.

Figure 9:
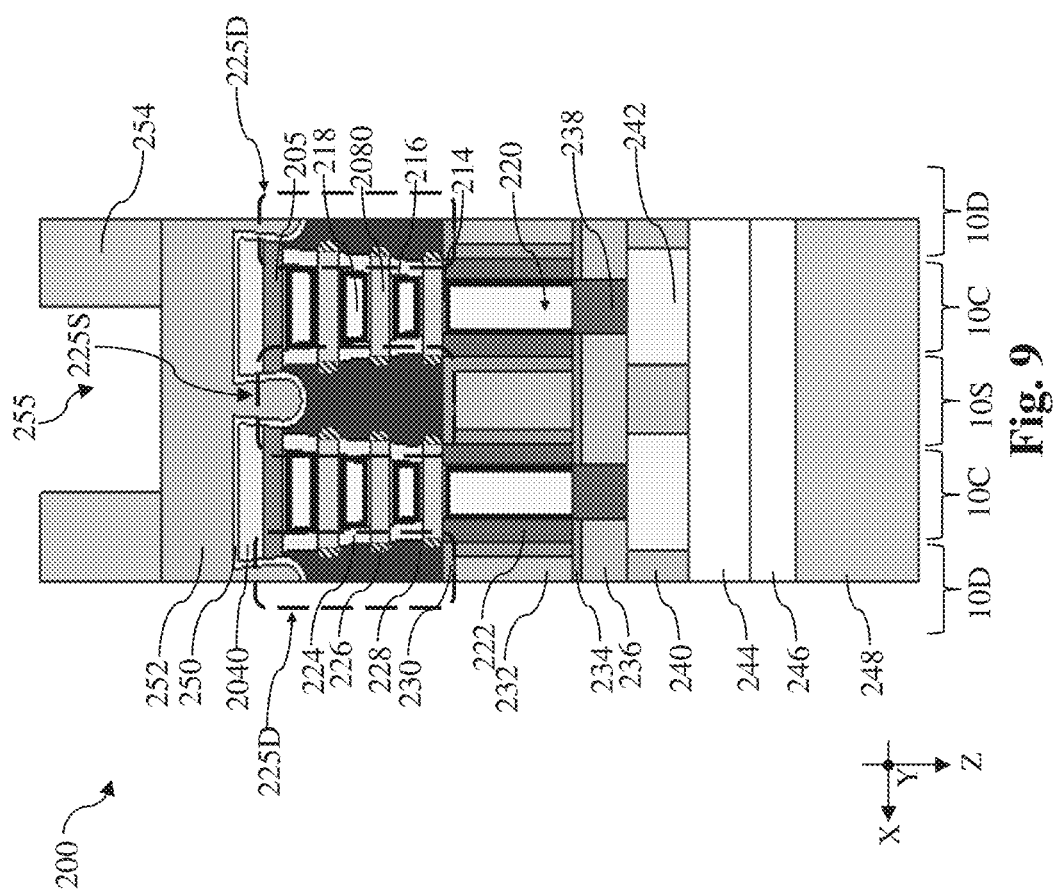

Referring to FIGS. 1 and 9, method 100 includes a block 108 where the source feature 225S and the drain feature 225D are selectively recessed from the back side of the workpiece 200. In some embodiments, the top silicon layer 203, the source feature 225S and the drain feature 225D are selectively recessed while the bottom dielectric layer 2040 is not substantially recessed. In some implementations, the recessing at block 108 is anisotropic such that the bottom semiconductor layer 205 is not substantially recessed. As shown in FIG. 9, the recessing at block 108 may remove a portion of the outer layer 226 that is in contact with the top silicon layer 203. That is, the recessing at block 108 may expose the inner layer 228 of the source features 225S or the drain features 225D.

Reference is briefly made to FIGS. 13A and 14A. Depending on how the lattice structures of the inner layer 228 and the chemistry of the selective recess at block 108, the inner layer 228 of the drain feature 225D and the source feature 225S may have a convex surface 268 as shown in FIG. 13A or a substantially planar surface 270 on the X-Y plane as shown in FIG. 14A. The convex surface 268 may include a recess between about 2 nm and about 10 nm.

Referring still to FIGS. 1 and 9, method 100 includes a block 110 wherein an etch stop layer (ESL) 250 and a second interlayer dielectric (ILD) layer 252 is deposited over the back side of the substrate 20. In some embodiments, the ESL layer 250 may share the same composition of the CESL 230 and the second ILD layer 252 may share the same composition of the first ILD layer 232. As shown in FIG. 9, the ESL 250 may conformally deposited using ALD, PECVD, or other suitable deposition methods and is disposed on sidewalls of the bottom semiconductor layer 205 and the bottom dielectric layer 2040 and on the source features 225S and the drain features 225D. The second ILD layer 252 may be deposited over the back side of the workpiece 200 by CVD, flowable CVD, or spin-on coating. The second ILD layer 252 is spaced apart from sidewalls of the bottom semiconductor layer 205, sidewalls of the bottom dielectric layer 2040, the source features 225S, and the drain features 225D by the ESL 250. As shown in FIG. 9, at least a portion of the ESL 250 and the second ILD layer 252 extend through the bottom semiconductor layer 205 and the bottom dielectric layer 2040 in the source region 10S and the drain region 10D.

Figure 10:
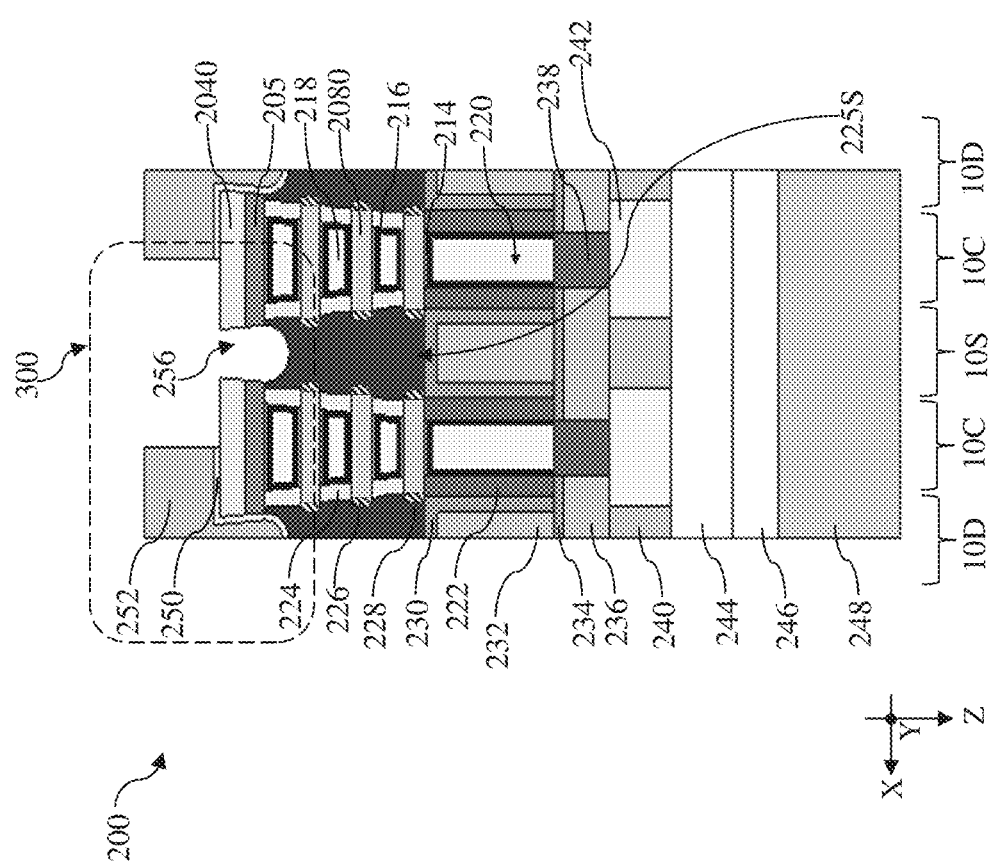
Figure 11:
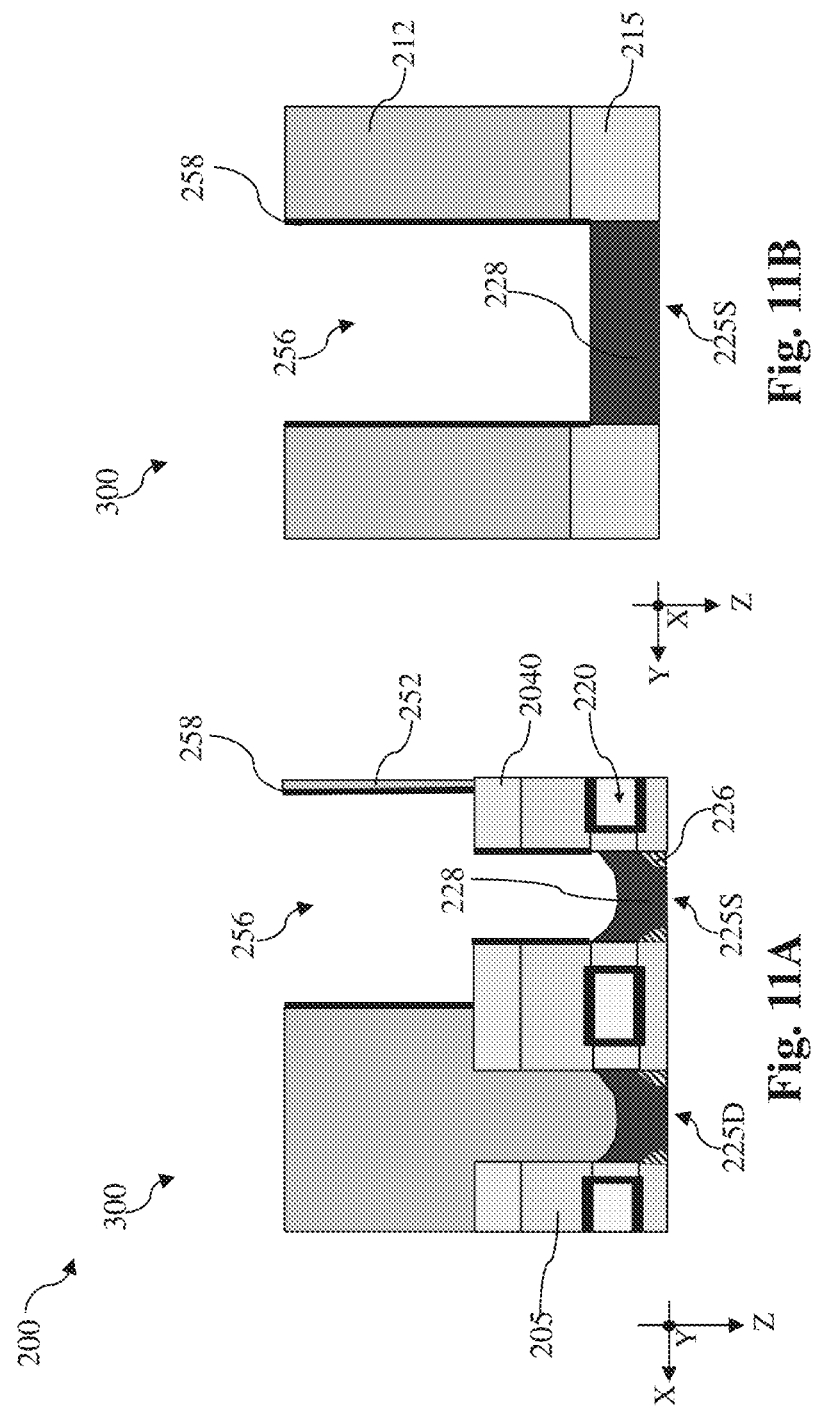
Figure 12:
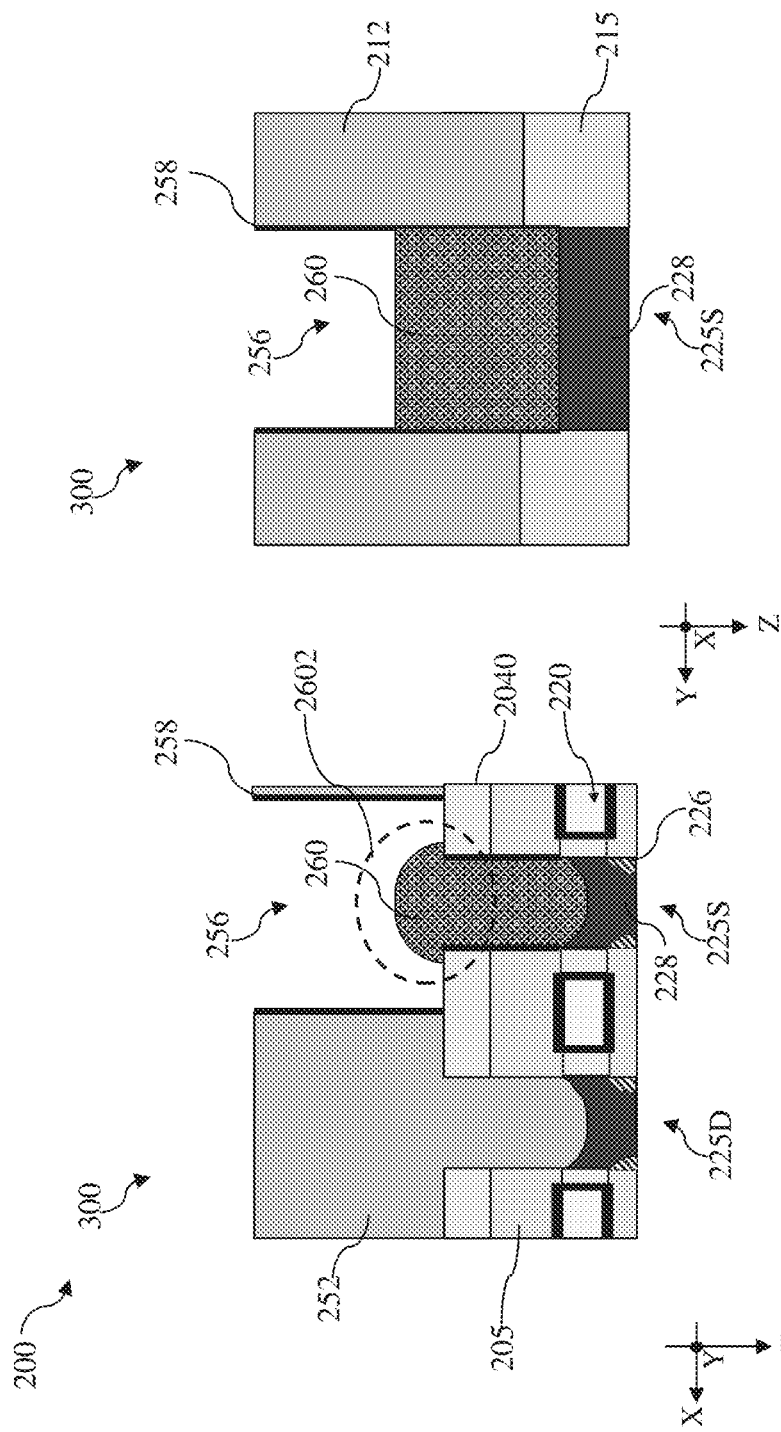
Figure 13:
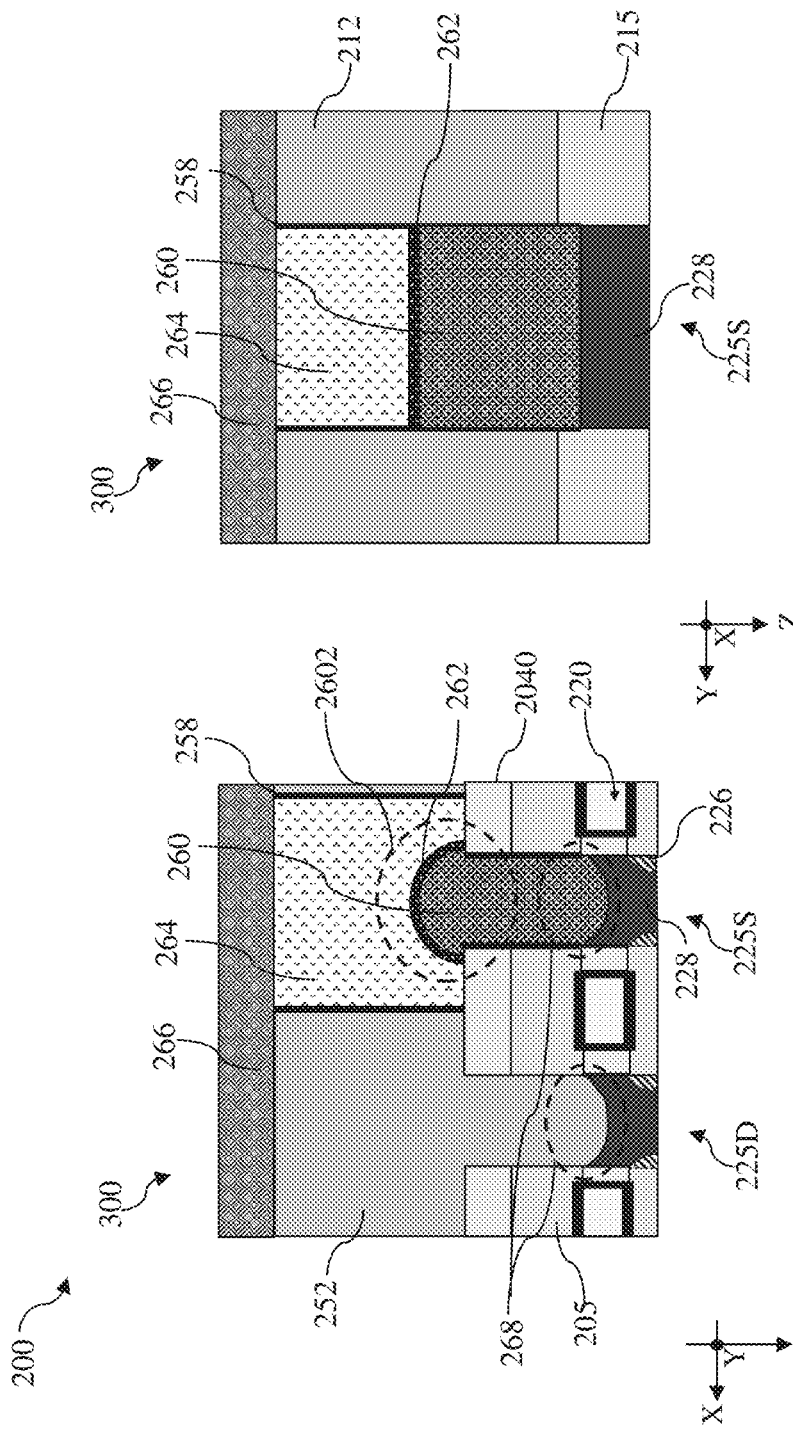
Figure 14:
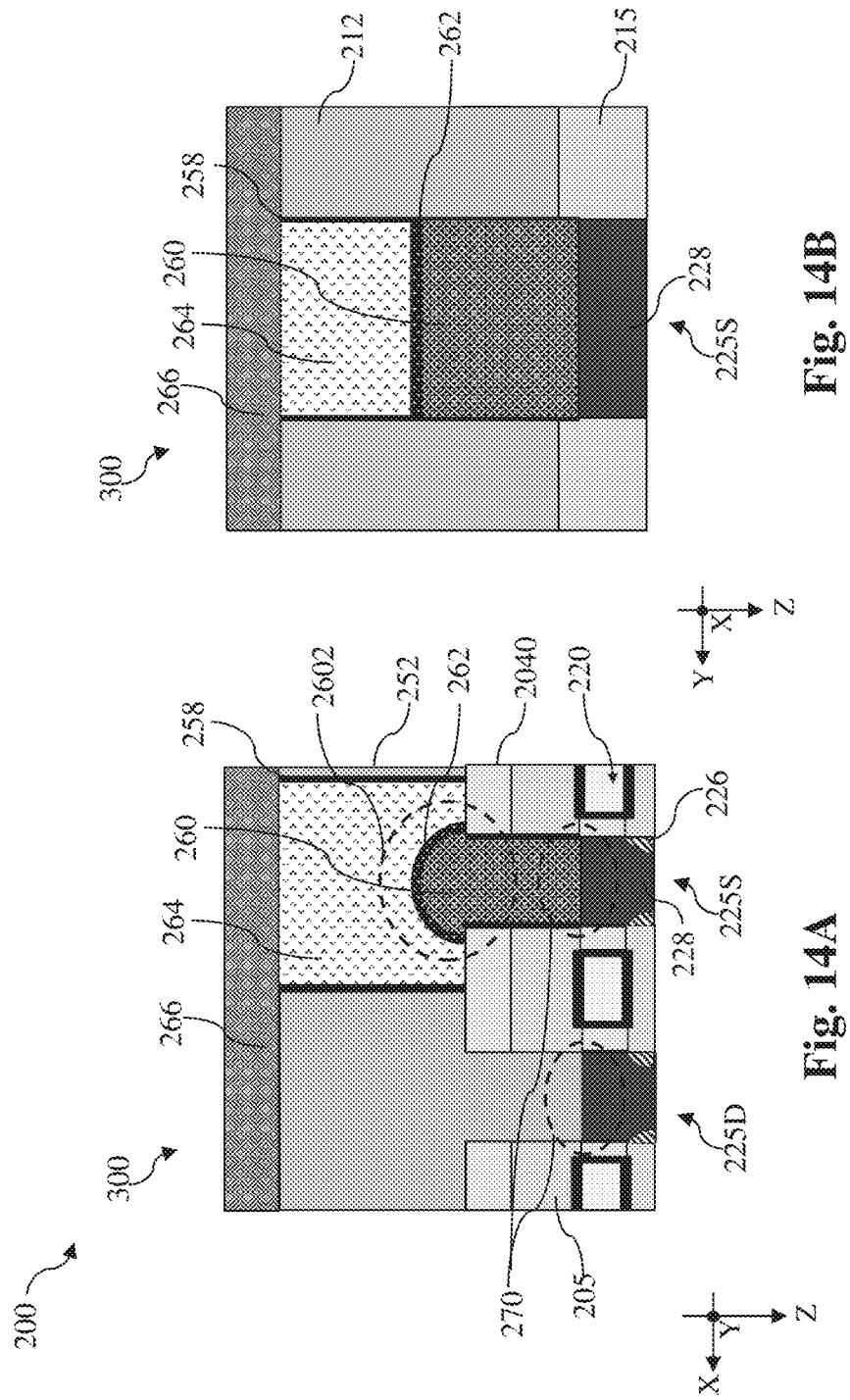
Figure 15:
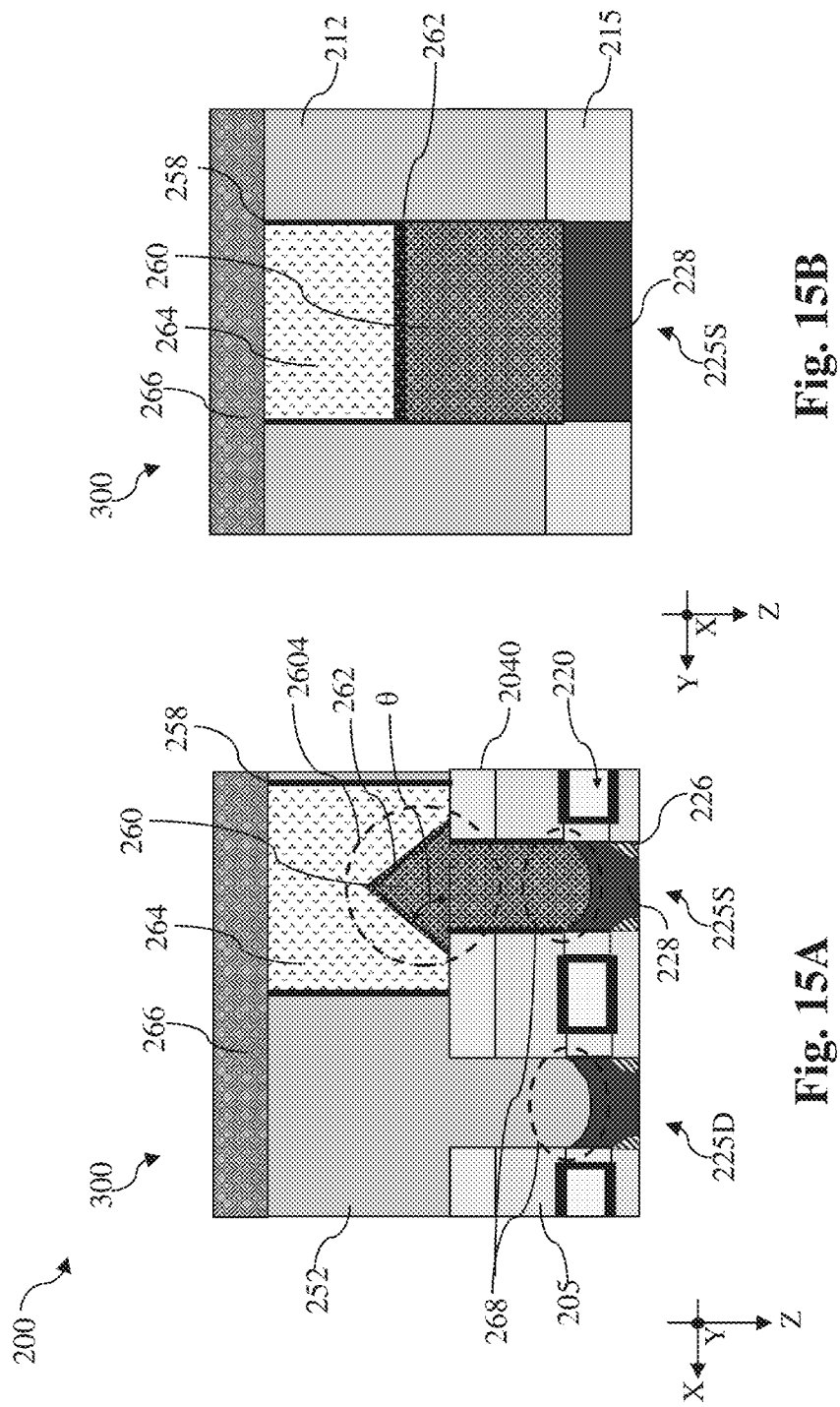

Referring to FIGS. 1, 9 and 10, method 100 includes a block 112 where a backside source contact opening 256 is selectively formed through the ESL 250 and the second ILD layer 252. In some embodiments represented in FIG. 9, a photoresist mask 254 may be formed over the back side of the workpiece 200. The photoresist mask 254 is disposed directly over the drain features 225D and includes a mask opening 255. Using the photoresist mask 254 as an etch mask, the ESL 250 and the second ILD layer 252 are anisotropically etched to expose the source feature 225S in a backside source contact opening 256. As shown in FIG. 10, the backside source contact opening 256 vertically extends through the second ILD layer 252, the ESL 250, the bottom dielectric layer 2040, and the bottom semiconductor layer 205 along the Z direction to expose the inner layer 228 of the source feature 225S.

To illustrate embodiments of the present disclosure in more detail, focus is directed to a backside contact region 300 shown as a dotted area in FIG. 10 and enlarged cross-sectional views of the backside contact region 300 are provided in FIGS. 11A-15A and 11B-15B. It is noted that the figures ending with a capital letter "A" include fragmentary cross-sectional views of the backside contact region 300 across a drain feature 225D and a source feature 225S with a viewing direction along the Y direction and the figures ending with a capital letter "B" include fragmentary cross-sectional views across only a source feature 225S with a viewing direction along the X direction. FIGS. 11B-15B reveal features that are not explicitly shown in FIGS. 2-10. For example, FIGS. 11B-15B illustrate the isolation feature 212 that is formed between fin-shaped structures 210 and a dielectric fin 215. The dielectric fin 215 may include silicon oxide, silicon nitride, silicon oxynitride, silicon oxycarbonitride, silicon carbonitride, aluminum oxide, zirconium oxide, hafnium oxide, or other suitable dielectric materials. The dielectric fin 215 functions to isolate neighboring source features 225S or drain features 225D and prevent the same from merging with one another.

Referring to FIGS. 1, 11A and 11B, method 100 includes a block 114 where a liner 258 is formed in the backside source contact opening 256. In some embodiments, the liner 258 may include silicon nitride and may be deposited over the back side of the workpiece 200 over the inner layer 228 of the source feature 225S, sidewalls of the bottom semiconductor layer 205, sidewalls of the bottom dielectric layer 2040, exposed top surfaces of the bottom dielectric layer 2040, sidewalls of the second ILD layer 252, and sidewalls of the isolation feature 212. After the deposition of the liner 258, an anisotropically etch back process is performed to remove the liner 258 from top-facing surfaces, such as the top surfaces of the bottom dielectric layers 2040, the top surfaces of the second ILD layer 252, the top surfaces of the isolation feature 212, and the top surface of the inner layer 228 of the source feature 225S. In some embodiments, the outer layer 226 of the source feature 225S is not exposed in the backside source contact opening 256.

Referring to FIGS. 1, 12A and 12B, method 100 includes a block 116 where an epitaxial extension feature 260 is deposited in the backside source contact opening 256. In some embodiments, the epitaxial extension feature 260 is deposited on the exposed inner layer 228 of the source feature 225S using molecular beam epitaxy (MBE), vapor-phase epitaxy (VPE), ultra-high vacuum CVD (UHV-CVD)), and/or other suitable epitaxial growth processes. The epitaxial extension feature 260 may include a doped semiconductor material. In embodiments where n-type MBC transistors are desired, the epitaxial extension feature 260 may include silicon doped with an n-type dopant, such as phosphorus (P), arsenic (As), or antimony (Sb). In embodiments where p-type MBC transistors are desired, the epitaxial extension feature may include silicon germanium doped with a p-type dopant, such as boron (B) or gallium (Ga). In some implementations, the epitaxial extension feature 260 is doped in-situ during its epitaxial deposition process. The epitaxial extension feature 260 may be selectively grown from the inner layer 228 of the source feature 225S during the epitaxial deposition process, while the dielectric liner 258 prevents direct growth of the epitaxial extension feature 260. As such, the epitaxial extension feature 260 is formed in a bottom-up manner. In this regard, the formation of the epitaxial extension feature 260 is also self-aligned as it does not epitaxially grow from the second ILD layer 252, the isolation feature 212, or the bottom dielectric layer 2040.

In some embodiments, the epitaxial extension feature 260 and the inner layer 228 of the source feature 225S may be formed of the same semiconductor material, such as silicon or silicon germanium. In these embodiments, the epitaxial extension feature 260 and the inner layer 228 of the source feature 225S may also include the same type of dopants and the same dopant species. For example, the epitaxial extension feature 260 and the inner layer 228 of the source feature 225S may both be formed of phosphorus-doped silicon (Si:P), arsenic-doped silicon (Si:As), antimony-doped silicon (Si:Sb), boron-doped silicon germanium (SiGe:B), or gallium-doped silicon germanium (SiGe:Ga). In some instances, in order to reduce contact resistance, a doping concentration in the epitaxial extension feature 260 is greater than a doping concentration in the inner layer 228 of the source feature 225S. For example, when both the epitaxial extension feature 260 and the inner layer 228 of the source feature 225S are formed of phosphorus-doped silicon (Si:P), a phosphorus concentration in the epitaxial extension feature 260 may be greater than a phosphorus concentration in the inner layer 228 of the source feature 225S. To protect the gate structure 220 and the front-side interconnect structure from thermal deterioration, a process temperature of the formation of the epitaxial extension feature 260 is smaller than 400° C., such as between about 260° C. and about 400° C. When the process temperature is greater than 400° C., copper in the front-side interconnect structure may undergo electro-migration to form voids, pits, or extrusions.

The epitaxial extension feature 260 functions as an extension of the inner layer 228 of the source feature 225S. Once the epitaxial extension feature 260 extends through the bottom semiconductor layer 205 and the bottom dielectric layer 2040, dimensions of the epitaxial extension feature 260 is allowed to expand in a first end portion 2602 (shown in FIG. 12A) or a second end portion 2604 (shown in FIG. 15A) along the Z direction and the X direction, in different embodiments. For example, along the X direction and at the level of the bottom dielectric layer 2040, the backside source contact opening 256 and the epitaxial extension feature 260 may have a width between about 8 nm and 20 nm. The first end portion 2602 (in the embodiment shown in FIG. 12A) or a second end portion 2604 (in the alternative embodiment shown in FIG. 15A) may have a greater width between about 8 nm and about 30 nm. The first end portion 2602 may be a result of isotropic epitaxial growth and has a rounded shape or a mushroom shape. The second end portion 2604 may be a result of faceted growth and has a rhombus or arrow shape. In some instances, the second end portion 2604 may include a facet angle θ between about 30° and about 70°. Compared to the inner layer 228, both the first end portion 2602 and the second end portion 2604 provide more surface areas to interface the backside source contact 264, which is formed of metal.

Referring to FIGS. 1, 13A, 13B, 14A, 14B, 15A, and 15B, method 100 includes a block 118 where a silicide layer 262 is formed on the epitaxial extension feature 260. To reduce contact resistance between the epitaxial extension feature 260 and the backside source contact 264, the silicide layer 262 may be formed on the first end portion 2602 (in embodiments shown in FIG. 13A or 14A) or the second end portion 2604 (in alternative embodiments shown in FIG. 15A) of the epitaxial extension feature 260, as the case may be. To form the silicide layer 262, a metal layer is deposited over the epitaxial extension feature 260 and an anneal process is performed to bring about silicidation reaction between the metal layer and the epitaxial extension feature 260. Suitable metal layer may include titanium (Ti), tantalum (Ta), nickel (Ni), cobalt (Co), or tungsten (W). The silicide layer 262 may include titanium silicide (TiSi), titanium silicon nitride (TiSiN), tantalum silicide (TaSi), tungsten silicide (WSi), cobalt silicide (CoSi), or nickel silicide (NiSi). In embodiments where the epitaxial extension feature 260 includes germanium, the silicide layer 262 may also include metal germanide or germanium-tin (GeSn). The silicide layer 262 generally tracks the shape of the first end portion 2602 (shown in FIG. 13A or 14A) or the second end portion 2604 (shown in FIG. 15A) of the epitaxial extension feature 260, as the case may be. Although not explicitly shown, the excess metal layer that does not form the silicide layer 262 may be removed at block 118.

Referring to FIGS. 1, 13A, 13B, 14A, 14B, 15A, and 15B, method 100 includes a block 120 where a backside source contact 264 is formed over the silicide layer 262. After the formation of the silicide layer 262, a metal fill layer may be deposited into the backside source contact opening 256 to form the backside source contact 264. The metal fill layer may include aluminum (Al), rhodium (Rh), ruthenium (Ru), copper (Cu), iridium (Ir), or tungsten (W). A planarization process, such as a CMP process, may follow to remove excess materials and provide a planar top surface. The backside source contact 264 wraps over the protrusive first end portion 2602 (in the embodiment shown in FIG. 13A or 14A) or the second end portion 2604 (in the alternative embodiment shown in FIG. 15A) of the epitaxial extension feature 260. As a result, the first end portion 2602 (in the embodiment shown in FIG. 13A or 14A) or the second end portion 2604 (in the alternative embodiment shown in FIG. 15A) of the epitaxial extension feature 260 extends into the backside source contact 264. As measured from a top surface of the bottom dielectric layer 2040 to a bottom surface of a buried power rail 266 (to be described below), the backside source contact 264 may have a thickness between about 10 nm and about 60 nm. Along the X direction, the backside source contact 264 may have a width between about 20 nm and about 40 nm. The backside source contact 264 may also be referred to a backside metal plug 264.

Referring to FIGS. 1, 13A, 13B, 14A, 14B, 15A, and 15B, method 100 includes a block 122 where a buried power rail 266 is formed over the backside source contact 264. While not explicitly shown, the buried power rail 266 may be defined in an insulation layer. In an example process, an insulation layer having a composition similar to the first ILD layer 232 may be deposited over the backside of the workpiece 200, including over the second ILD layer 252 and the backside source contact 264. Then, a power rail trench may be patterned in the insulation layer. A barrier layer and a metal fill material are then deposited into the power rail trench to form the buried power rail 266. In some embodiments, the barrier layer in the buried power rail 266 may include titanium nitride, tantalum nitride, cobalt nitride, nickel nitride, or tungsten nitride and the metal fill material in the buried power rail 266 may include titanium (Ti), ruthenium (Ru), copper (Cu), nickel (Ni), cobalt (Co), tungsten (W), tantalum (Ta), or molybdenum (Mo). The barrier layer and the metal fill layer may be deposited using PVD, CVD, ALD, or electroless plating. A planarization process, such as a CMP process, may be performed to remove excess materials. In some instances, the buried power rail 266 may have a thickness between about 10 nm and about 60 nm, along the Z direction.

Figure 16:
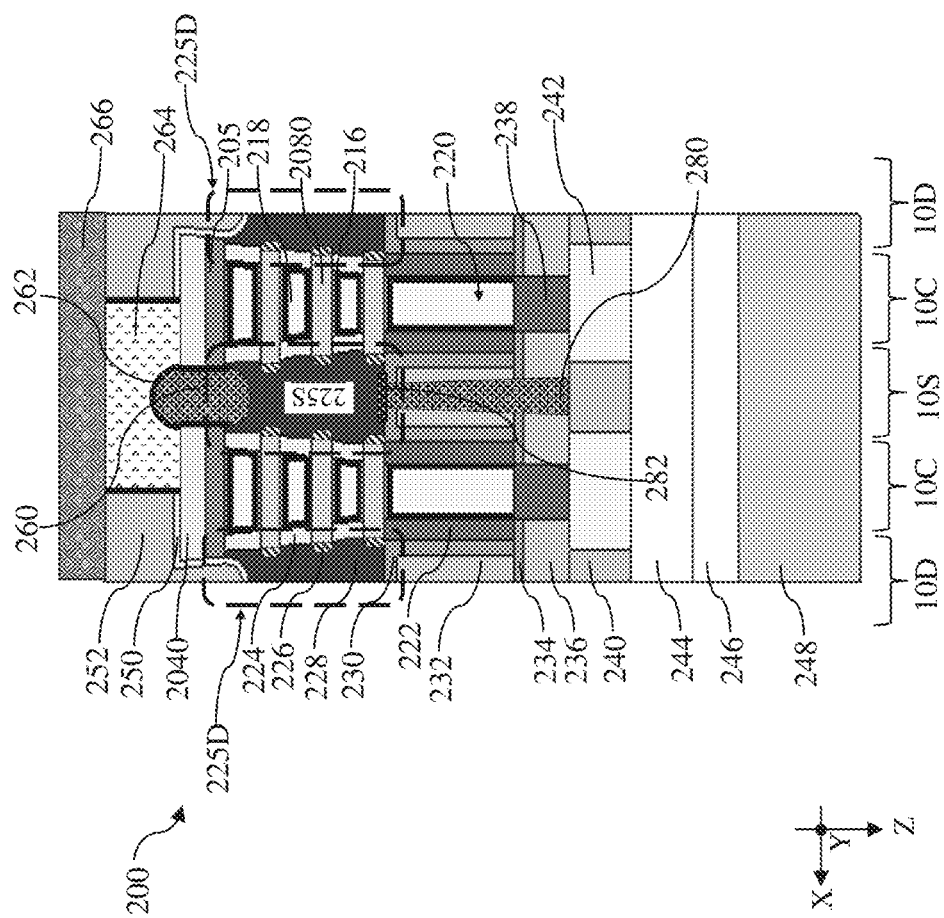
FIG. 16 illustrates a fragmentary cross-sectional view of a semiconductor device that includes a source feature coupled to two source contacts, according to one or more aspects of the present disclosure.

Reference is now made to FIG. 16, which illustrates an alternative embodiment of the present disclosure. While the epitaxial extension feature 260 of the present disclosure may increase interfacial area and reduce contact resistance to the source feature 225S, a frontside source contact 280 may also be formed if further lowering of contact resistance is desired. As shown in FIG. 16, the source feature 225S of the semiconductor device 200 is coupled to both a frontside source contact 280 and the epitaxial extension feature 260. While not explicitly shown, the frontside source contact 280 is coupled to a frontside power rail in the frontside interconnect structure by way of a frontside silicide layer 282. The epitaxial extension feature 260 is electrically coupled to the buried power rail 266 by way of the silicide layer 262 as well as the backside source contact 264. As such, the source feature 225S in the semiconductor device 200 in FIG. 16 is coupled to two power rails—a frontside power rail and the buried power rail 266.

Embodiments of the present disclosure provide advantages. For example, the present disclosure provides embodiments of backside contact structures where an epitaxial extension feature is disposed between a source feature and a backside source contact. The epitaxial extension feature is formed of a doped semiconductor material and provides an increased surface area to interface the backside source contact. The increased surface area may reduce the resistance at the metal-semiconductor interface, easing the bottleneck of contact resistance.

In one exemplary aspect, the present disclosure is directed to a semiconductor device structure. The semiconductor device structure includes a source feature and a drain feature, at least one channel structure extending between the source feature and the drain feature, a gate structure wrapped around each of the at least one channel structure, a semiconductor layer over the gate structure, a dielectric layer over the semiconductor layer, a doped semiconductor feature extending through the semiconductor layer and the dielectric layer to be in contact with the source feature, a metal contact plug over the doped semiconductor feature, and a buried power rail disposed over the metal contact plug.

In some embodiments, the semiconductor layer includes silicon. In some implementations, the source feature, the drain feature, and the doped semiconductor feature include silicon, silicon germanium, or germanium. In some instances, the source feature, the drain feature, and the doped semiconductor feature further include phosphorus, arsenic, antimony, boron, or gallium. In some embodiments, the semiconductor device structure may further include a silicide layer disposed at an interface between the doped semiconductor feature and the metal contact plug. In some embodiments, the doped semiconductor feature partially extends into the metal contact plug. In some embodiments, the source feature includes an outer layer in contact with the at least one channel structure and an inner layer spaced apart from the at least one channel structure. In some implementations, the doped semiconductor feature is in contact with the inner layer and is spaced apart from the outer layer.

In another exemplary aspect, the present disclosure is directed to a semiconductor device. The semiconductor device includes a source feature and a drain feature, a plurality of channel members disposed between the source feature and the drain feature along a direction, a gate structure wrapping around each of the plurality of channel members, a silicon layer disposed over the gate structure, a first dielectric layer disposed over the silicon layer, a second dielectric layer disposed over the first dielectric layer, a metal contact feature disposed in the second dielectric layer and over the source feature, and an epitaxial extension feature disposed between the source feature and the metal contact feature. A portion of the second dielectric layer extends through the silicon layer and the first dielectric layer to be in contact with the drain feature. The epitaxial extension feature extends through the silicon layer and the first dielectric layer.

In some embodiments, the source feature, the drain feature, and the epitaxial extension feature include silicon, silicon germanium, or germanium. In some implementations, the source feature, the drain feature, and the epitaxial extension feature further include phosphorus, arsenic, antimony, boron, or gallium. In some instances, the semiconductor device may further include a silicide layer disposed at an interface between the epitaxial extension feature and the metal contact feature. In some embodiments, the epitaxial extension feature includes an end portion that extends into the metal contact feature. In some instances, the end portion includes a rhombus shape. In some embodiments, the end portion includes a rounded shape.

In yet another exemplary aspect, the present disclosure is directed to a method. The method includes receiving a workpiece that includes a source feature and a drain feature disposed over a substrate, a plurality of channel members extending between the source feature and the drain feature, the plurality of channel members being disposed over a bottom silicon layer and a bottom dielectric layer, and a gate structure wrapping around each of the plurality of channel members, bonding a front side of the workpiece to a carrier substrate and flipping the workpiece over, selectively removing the substrate to expose the source feature and the drain feature from a back side of the workpiece, wherein the back side is opposite to the front side, depositing a dielectric layer over the back side of the workpiece, after the depositing of the dielectric layer, forming a backside source contact opening through the dielectric layer to expose the source feature, epitaxially depositing an extension feature in the backside source contact opening, and depositing a metal fill layer over the extension feature.

In some embodiments, the method may further include before the depositing of the dielectric layer, depositing an etch stop layer over the back side of the workpiece. In some implementations, the backside source contact opening extends through the dielectric layer, the bottom silicon layer, and the bottom dielectric layer. In some instances, after the depositing of the metal fill layer, the extension feature partially extends into the metal fill layer. In some embodiments, the metal fill layer does not extend through the bottom silicon layer and the bottom dielectric layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a source feature;
   a vertical stack of nanostructures in contact with a sidewall of the source feature;
   a gate structure wrapped around each of the vertical stack of nanostructures;
   a semiconductor layer over the gate structure;
   a dielectric layer over the semiconductor layer;
   a doped semiconductor feature extending through the semiconductor layer and the dielectric layer to be in contact with the source feature; and
   a metal contact plug over the doped semiconductor feature,
   wherein the doped semiconductor feature partially extends into the metal contact plug.

2. The semiconductor structure of claim 1, wherein the semiconductor layer comprises silicon.

3. The semiconductor structure of claim 1, wherein the dielectric layer comprises silicon oxide, silicon nitride, aluminum oxide, hafnium oxide, or zirconium oxide.

4. The semiconductor structure of claim 1, further comprising:
   a silicide layer disposed at an interface between the doped semiconductor feature and the metal contact plug.

5. The semiconductor structure of claim 1, further comprising:
   an etch stop layer (ESL) disposed on the dielectric layer; and
   an interlayer dielectric (ILD) layer over the ESL,
   wherein the metal contact plug is disposed in the ESL and the ILD layer such that sidewalls of the metal contact plug are in contact with sidewalls of the ESL and the ILD layer.

6. The semiconductor structure of claim 5, further comprising:
   a drain feature in contact with sidewalls of the vertical stack of nanostructures such that the vertical stack of nanostructures are sandwiched between the source feature and the drain feature along a direction,
   wherein a portion of the ESL penetrates the dielectric layer and the semiconductor layer to partially extend into the drain feature.

7. The semiconductor structure of claim 6, wherein a portion of the ILD layer also penetrates the dielectric layer and the semiconductor layer to partially extends into the drain feature.

8. The semiconductor structure of claim 6, wherein the ESL is in direct contact with sidewalls of the dielectric layer and the semiconductor layer.

9. The semiconductor structure of claim 6, wherein a portion of the semiconductor layer and a portion of the dielectric layer are sandwiched between the doped semiconductor feature and the ESL along the direction.

10. A semiconductor structure, comprising:
    a source feature and a drain feature;
    a plurality of nanostructures sandwiched between the source feature and the drain feature along a direction;
    a gate structure wrapping around each of the plurality of nanostructures;
    a silicon layer disposed over the gate structure;
    a plurality of inner spacer features interleaving the plurality of nanostructures and the silicon layer;
    a dielectric layer disposed over the silicon layer; and
    an epitaxial extension feature arising from a top surface of the source feature and extending through the silicon layer and the dielectric layer.

11. The semiconductor structure of claim 10, wherein at least one of the plurality of inner spacer features is in direct contact with the silicon layer.

12. The semiconductor structure of claim 10, wherein the source feature, the drain feature, and the epitaxial extension feature comprise silicon and an n-type dopant.

13. The semiconductor structure of claim 10, wherein the source feature, the drain feature, and the epitaxial extension feature comprise silicon germanium and a p-type dopant.

14. The semiconductor structure of claim 10, further comprising:
    an etch stop layer (ESL) disposed on the dielectric layer;
    an interlayer dielectric (ILD) layer over the ESL; and
    a metal contact feature disposed over the dielectric layer and the epitaxial extension feature,
    wherein the metal contact feature is disposed in the ESL and the ILD layer such that sidewalls of the metal contact feature are in contact with sidewalls of the ESL and the ILD layer.

15. The semiconductor structure of claim 14, wherein a portion of the ESL penetrates the dielectric layer and the silicon layer to partially extend into the drain feature.

16. The semiconductor structure of claim 15, wherein the ESL is in direct contact with sidewalls of the dielectric layer and the silicon layer.

17. A method, comprising:
    receiving a workpiece comprising:
      a source feature and a drain feature,
      a plurality of nanostructures extending between the source feature and the drain feature,
      a gate structure wrapping around each of the plurality of nanostructures,
      a bottom semiconductor layer over the gate structure,
      a bottom dielectric layer over the bottom semiconductor layer, and
      a top semiconductor layer over the bottom dielectric layer;
    selectively recessing the top semiconductor layer, the source feature and the drain feature;

after the selectively recessing, depositing an etch stop layer (ESL) over the workpiece such that the etch stop layer is in contact with sidewalls of the bottom dielectric layer and the bottom semiconductor layer;

depositing an interlayer dielectric (ILD) layer over the ESL;

forming a backside contact opening in the ESL and the ILD layer to selectively expose the source feature;

epitaxially depositing an extension feature in the backside contact opening and on the source feature; and depositing a metal fill layer over the extension feature.

18. The method of claim 17, wherein the ESL is in direct contact with the drain feature.

19. The method of claim 17, wherein the bottom semiconductor layer and the top semiconductor layer comprise silicon, wherein the bottom dielectric layer comprises silicon oxide, silicon nitride, aluminum oxide, hafnium oxide, or zirconium oxide.

20. The method of claim 17, wherein a portion of the extension feature overhangs a top surface of the bottom dielectric layer.

* * * * *